(12) United States Patent
Lee

(10) Patent No.: US 7,535,307 B2
(45) Date of Patent: May 19, 2009

(54) INTERNAL VOLTAGE GENERATOR AND SEMICONDUCTOR MEMORY DEVICE HAVING THE SAME, AND METHOD OF GENERATING INTERNAL VOLTAGE

(75) Inventor: Seong Jun Lee, Chungcheongbuk-do (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 232 days.

(21) Appl. No.: 11/633,057

(22) Filed: Dec. 4, 2006

(65) Prior Publication Data

US 2008/0007349 A1     Jan. 10, 2008

(30) Foreign Application Priority Data

Jun. 16, 2006   (KR) ...................... 10-2006-0054415

(51) Int. Cl.
*H03B 1/00* (2006.01)
*H03K 3/01* (2006.01)
(52) U.S. Cl. ............................ 331/57; 331/74; 327/534
(58) Field of Classification Search .................. 331/49, 331/57, 74; 327/534–537
See application file for complete search history.

(56) References Cited

U.S. PATENT DOCUMENTS 5,075,572 A * 12/1991 Poteet et al. ................ 327/536

FOREIGN PATENT DOCUMENTS

| KR | 1020060000867 | 1/2006 |
|---|---|---|
| KR | 1020060044240 | 5/2006 |

OTHER PUBLICATIONS

Notice of Allowance for Korean App. 10-2006-0054415.

* cited by examiner

*Primary Examiner*—David Mis
(74) *Attorney, Agent, or Firm*—Lowe Hauptman Ham & Berner, LLP

(57) ABSTRACT

An internal voltage generator includes an oscillator, a cycle control unit and a voltage generator. The oscillator periodically generates a pulse-shaped oscillation signal. The cycle control unit bypasses the oscillation signal to an output node, or selectively controls the cycle of the oscillation signal and output a controlled oscillation signal to the output node. The voltage generator generates an internal voltage in response to the oscillation signal or the controlled oscillation signal received through the output node. The cycle of the controlled oscillation signal is shorter than that of the oscillation signal. The operating speed of the voltage generator when receiving the controlled oscillation signal is faster than that of the voltage generator when receiving the oscillation signal.

38 Claims, 8 Drawing Sheets

INTERNAL VOLTAGE GENERATOR AND SEMICONDUCTOR MEMORY DEVICE HAVING THE SAME, AND METHOD OF GENERATING INTERNAL VOLTAGE

BACKGROUND

1. Field of the Invention

The present invention relates, in general, to semiconductor devices and, more particularly, to an internal voltage generator and a semiconductor memory device having the same, and a method of generating an internal voltage.

2. Discussion of Related Art

In general, a semiconductor memory device includes an internal voltage generator for generating internal voltages based on external voltages. The internal voltage generator generates internal voltages with various levels and supplies the internal voltages to several circuits within the semiconductor memory device. Of the internal voltages, voltages that are mainly supplied to an internal core circuit of the semiconductor memory device include a boosting voltage VPP and a back bias voltage VBB. The boosting voltage VPP is higher than an external voltage VDD and is supplies to a word line driver and a bit line isolation circuit within the semiconductor memory device. The back bias voltage VBB is lower than the external voltage VDD. The back bias voltage VBB is supplied to a transistor in order to compensate for the loss of the threshold voltage of the transistor included in an internal circuit (in particular, a memory cell array) of the semiconductor memory device. Meanwhile, the boosting voltage VPP is used to power the word line driver. Accordingly, if the number of word line drivers that operate at once (that is, the number of word lines that are enabled at the same time) is increased, the boosting voltage VPP may temporarily drop. This phenomenon may occur in a word line test process (i.e., one of test processes performed in, for example, a wafer burn-in (WFBI) test mode). The word line test process can be performed in such a manner that stress is applied to word lines connected to a memory cell array by alternately enabling the word lines or enabling all the word lines at the same time. If all the word lines are enabled at one time in the word line test process, however, current consumption is increased due to the word line drivers, which may temporarily drop the boosting voltage VPP. This will be described in more detail with reference to FIG. 1. Word line drivers (not shown) enable word lines WL0 to WLK (K is an integer) at the same time in response to a test signal TALLWD. At a point of time P at which the word lines WL0 to WLK are enabled, the boosting voltage VPP abruptly drops and, therefore, becomes lower than the external voltage VDD despite the fact that the boosting voltage VPP must be higher than the external voltage VDD. If the boosting voltage VPP is lower the external voltage VDD as described above, the internal circuits of the semiconductor memory device may malfunction. Meanwhile, the back bias voltage VBB is generally dependent on the external voltage VDD. Accordingly, during a power-up period of the semiconductor memory device (that is, a time in which the external voltage VDD begins rising and then become a stable voltage), it is difficult to shorten the time D1 (refer to FIG. 2) taken for the back bias voltage VBB to become a stable voltage level. This is because the internal voltage generator generates the back bias voltage VBB on the basis of the external voltage VDD. That is, as shown in FIG. 2, the internal voltage generator does not generate a stable back bias voltage VBB until the external voltage VDD becomes a set voltage VL1. Accordingly, if the time D1 taken for the back bias voltage VBB to become a stable voltage level during the power-up period is shortened, the operational performance of the semiconductor memory device will become further improved.

SUMMARY OF THE INVENTION

Accordingly, the present invention addresses the above problems, and discloses an internal voltage generator capable of generating a stable internal voltage rapidly in such a manner that the operating speed of the internal voltage generator is controlled by selectively controlling the cycle of an oscillation signal output from an oscillator depending on variation in surrounding environment.

Furthermore, the present invention discloses a semiconductor memory device including an internal voltage generator capable of generating a stable internal voltage rapidly in such a manner that the operating speed of the internal voltage generator is controlled by selectively controlling the cycle of an oscillation signal output from an oscillator depending on variation in surrounding environment.

Furthermore, the present invention discloses a method of generating an internal voltage, in which it can generate a stable internal voltage rapidly in such a manner that the operating speed of the internal voltage generator is controlled by selectively controlling the cycle of an oscillation signal output from an oscillator depending on variation in surrounding environment.

An internal voltage generator according to an aspect of the present invention includes an oscillator, a cycle control unit and a voltage generator. The oscillator periodically generates an oscillation signal of a pulse shape. The cycle control unit bypasses the oscillation signal to an output node, or selectively controls the cycle of the oscillation signal and output a controlled oscillation signal to the output node, in response to a test signal and a selection signal. The voltage generator generates an internal voltage in response to the oscillation signal or the controlled oscillation signal received through the output node. Preferably, the cycle of the controlled oscillation signal is shorter than that of the oscillation signal. Preferably, the operating speed of the voltage generator when receiving the controlled oscillation signal is faster than that of the voltage generator when receiving the oscillation signal. Furthermore, the test signal is generated at the time of a test operation of a word line of a semiconductor memory device.

An internal voltage generator according to another aspect of the present invention includes an oscillator, a voltage detector, a cycle control unit and a voltage generator. The oscillator periodically generates an oscillation signal of a pulse shape. The voltage detector detects an external voltage and outputs a detection signal according to the detection result. The cycle control unit bypasses the oscillation signal to an output node, or selectively controls a cycle of the oscillation signal and outputs a controlled oscillation signal to the output node, in response to a detection signal and a selection signal. The voltage generator generates an internal voltage in response to the oscillation signal or the controlled oscillation signal received through the output node. The cycle of the controlled oscillation signal may be shorter than the cycle of the oscillation signal. An operating speed of the voltage generator when receiving the controlled oscillation signal may be faster than that of the voltage generator when receiving the oscillation signal.

A semiconductor memory device according to still another aspect of the present invention includes a memory cell array, a plurality of word line drivers, and an internal voltage generator. The plurality of word line drivers are respectively connected to a plurality of word lines included in the memory cell array. The word line drivers use a boosting voltage for operating power and enable the plurality of word lines, respectively, in response to a test signal or an address decoding signal. The internal voltage generator generates the boosting voltage in response to the test signal and a selection signal. In a test mode, the plurality of word line drivers may enable the plurality of word lines at a time in response to the test signal. In a normal mode, one of the plurality of word line drivers may enable one of the plurality of word lines in response to the address decoding signal. Furthermore, an operating speed of the internal voltage generator may differ in the test mode and the normal mode.

A semiconductor memory device according to still another aspect of the present invention includes a memory cell array and an internal voltage generator. The memory cell array includes a plurality of memory cells respectively connected to a plurality of word lines and a plurality of bit lines. Each of the memory cells includes a cell transistor. The internal voltage generator detects an external voltage, generates a back bias voltage according to the detection result, and supplies the back bias voltage to a bulk of the cell transistor. Preferably, an operating speed of the internal voltage generator differs when the external voltage is higher than and lower than a detection voltage.

A method of generating an internal voltage according to still another aspect of the present invention includes the steps of periodically generating an oscillation signal of a pulse shape, at the time of a test operation of a device using a boosting voltage for operating power, generating a controlled oscillation signal having a cycle shorter than that of the oscillation signal based on the oscillation signal, generating the boosting voltage based on the controlled oscillation signal, and when the test operation of the device using the boosting voltage as the operating power is ended, generating the boosting voltage based on the oscillation signal.

A method of generating an internal voltage according to still another aspect of the present invention includes the steps of periodically generating an oscillation signal of a pulse shape, when an external voltage is lower than a detection voltage, generating a controlled oscillation signal having a cycle shorter than that of the oscillation signal based on the oscillation signal, generating back bias voltage based on the controlled oscillation signal, and when the external voltage is higher than the detection voltage, generating the back bias voltage based on the oscillation signal.

DETAILED DESCRIPTION OF EMBODIMENTS

Now, specific embodiments according to the present patent will be described with reference to the accompanying drawings.

Figure 1:
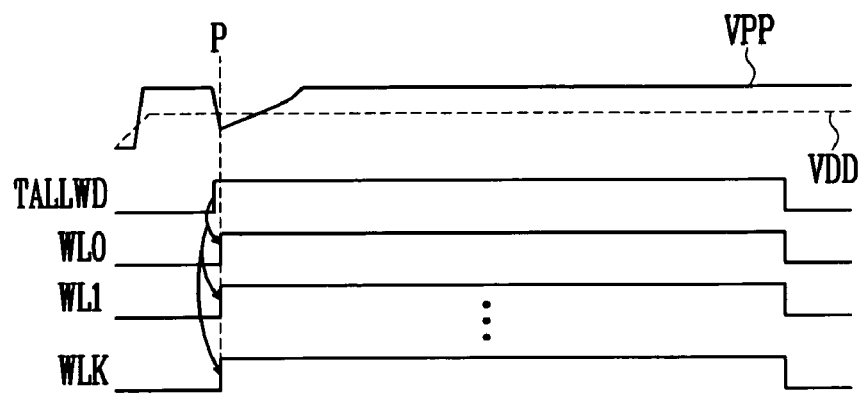
FIG. 1 is a timing diagram illustrating variation in a boosting voltage generated by a conventional internal voltage generator and signals related to the test operation of a semiconductor memory device.
Figure 2:
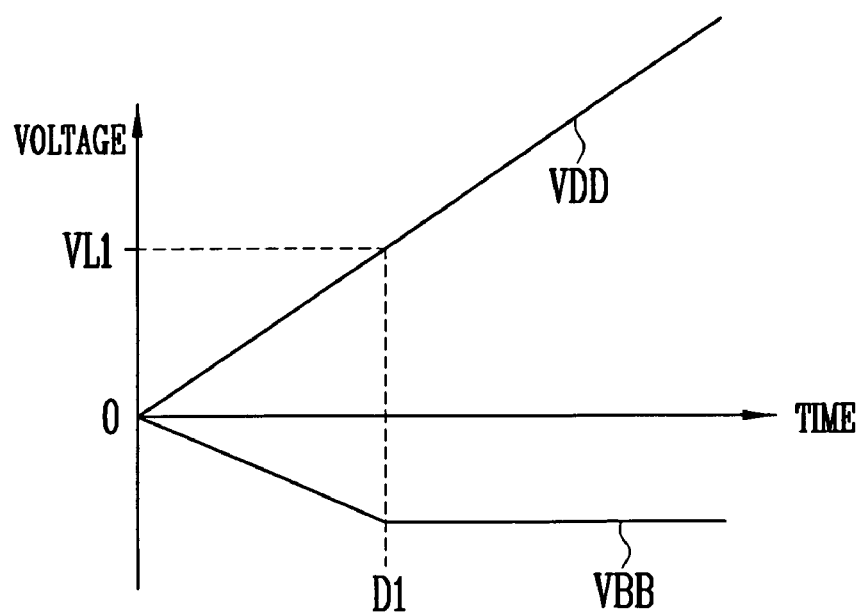
FIG. 2 is a graph showing a back bias voltage generated by the conventional internal voltage generator and an external voltage.
Figure 3:
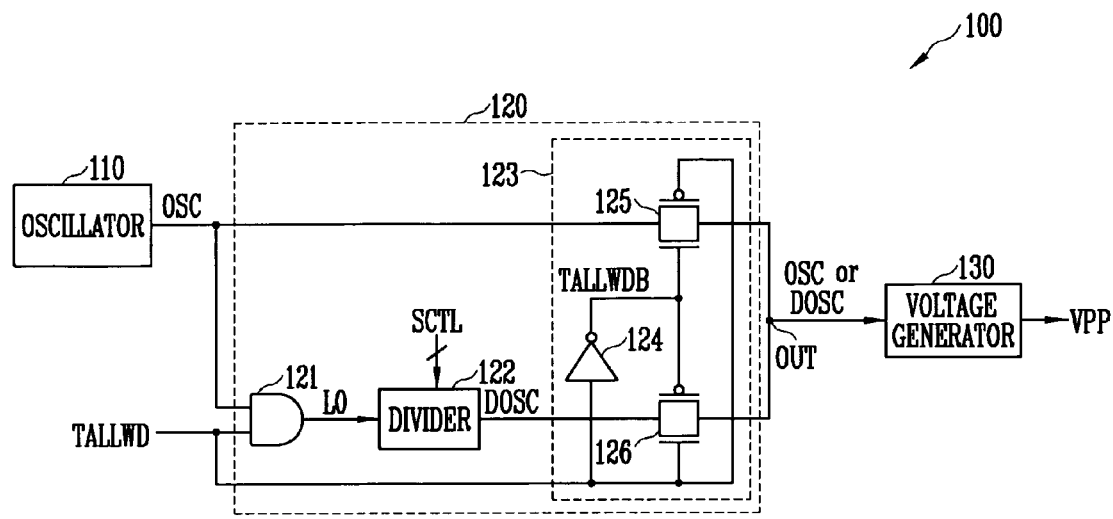
FIG. 3 is a circuit diagram of an internal voltage generator according to an embodiment of the present invention.

FIG. 3 is a circuit diagram of an internal voltage generator according to an embodiment of the present invention. Referring to FIG. 3, an internal voltage generator 100 includes an oscillator 110, a cycle control unit 120 and a voltage generator 130. The oscillator 110 periodically generates a pulse-shaped oscillation signal. The cycle control unit 120 bypasses the oscillation signal OSC to an output node OUT, or selectively controls the cycle of the oscillation signal OSC and outputs a controlled oscillation signal DOSC to the output node OUT in response to a test signal TALLWD and a selection signal SCTL. In more detail, the cycle control unit 120 includes a control logic circuit 12 1, a divider 122 and a selection circuit 123. The control logic circuit 121 outputs a divided, input signal LO in response to the test signal TALLWD and the oscillation signal OSC. Preferably, the control logic circuit 121 may be implemented using an AND gate. In this case, when the test signal TALLWD is at a high level, the control logic circuit 121 outputs the oscillation signal OSC as the divided input signal LO. Furthermore, when the test signal TALLWD is at a low level, the control logic circuit 121 outputs the divided input signal LO at a low level. The divider 122 divides the cycle of the divided input signal LO into predetermined cycles and outputs the controlled oscillation signal DOSC in response to the selection signal SCTL. Preferably, the cycle of the controlled oscillation signal DOSC is shorter than that of the oscillation signal OSC. The selection circuit 123 selects one of the oscillation signal OSC and the controlled oscillation signal DOSC and outputs it to the output node OUT in response to the test signal TALLWD. The selection circuit 123 includes an inverter 124 and transfer gates 125 and 126. The inverter 124 inverts the test signal TALLWVD and outputs an inverted test signal TALLWDB. The transfer gate 125 is connected between an output terminal of the oscillator 110 and the output node OUT, and the transfer gate 126 is connected between an output terminal of the divider 122 and the output node OUT. The transfer gates 125 and 126 are respectively turned on or off in response to the test signal TALLWD and the inverted test signal TALLWDB. Preferably, when the test signal TALLWD is at a high level (that is, when it is enabled), the transfer gate 126 is turned on and the transfer gate 125 is turned off. In contrast, when the test signal TALLWD is at a low level (that is, when it is disabled), the transfer gate 125 is turned on and the transfer gate 126 is turned off. The voltage generator 130 generates a boosting voltage VPP (i.e., an internal voltage) in response to the oscillation signal OSC or the controlled oscillation signal DOSC received through the output node OUT. The operating speed of the voltage generator 130 is faster when receiving the controlled oscillation signal DOSC than when receiving the oscillation signal OSC.

Figure 4:
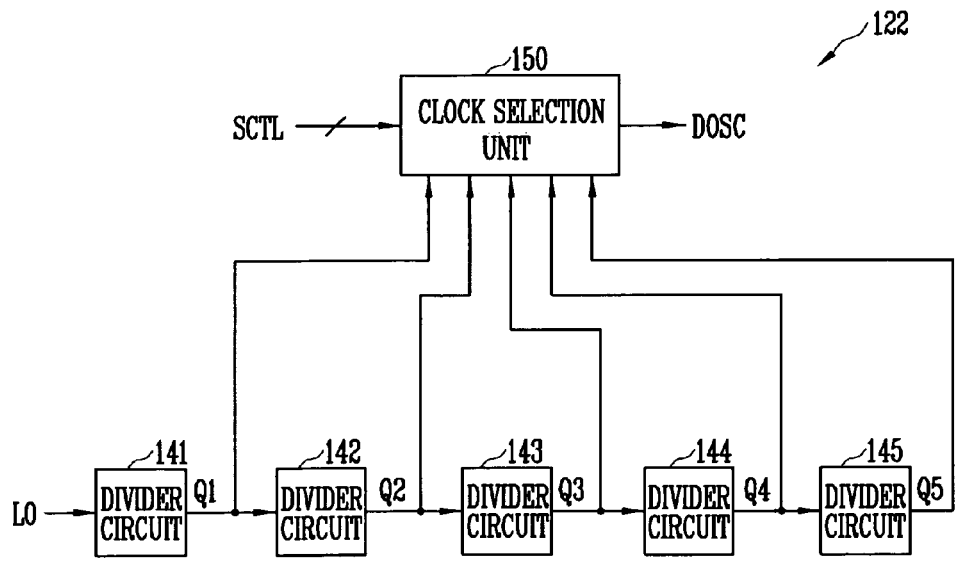
FIG. 4 is a detailed block diagram of a divider shown in FIG. 3.

FIG. 4 is a detailed block diagram of the divider shown in FIG. 3. Referring to FIG. 4, the divider 122 includes divider circuits 141 to 145 and a clock selection unit 150. The divider circuits 141 to 145 are connected in series and generate divided signals Q1 to Q5, respectively. The divider circuit 141 divides the divided input signal LO and outputs a divided signal Q1. The divider circuit 142 divides the divided signal Q1 and outputs a divided signal Q2. The divider circuits 143 to 145 operate in a similar way to the divider circuit 142. In this case, the number of the divider circuits included in the divider 122 may be changed, if appropriate. The clock selection unit 150 selects one of the divided signals Q1 to Q5 and outputs the selected signal as the controlled oscillation signal DOSC, in response to the selection signal SCTL. The selection signal SCTL may include a plurality of bits (not shown). The clock selection unit 150 selects one of the divided signals Q1 to Q5 according to a bit value of the selection signal SCTL.

Figure 5:
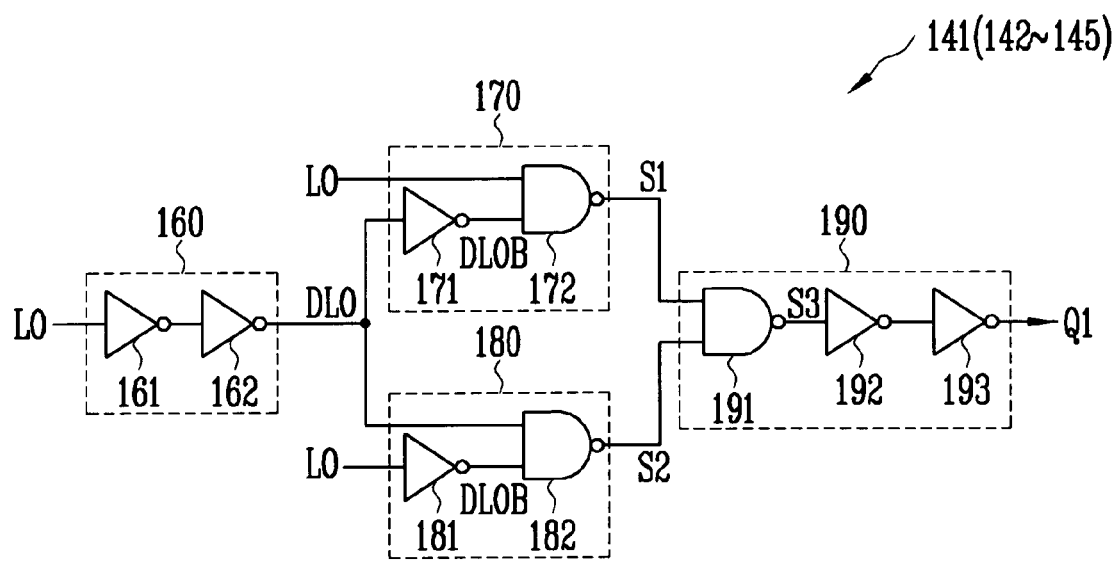
FIG. 5 is a detailed circuit diagram of a divider circuit shown in FIG. 4.
Figure 6:
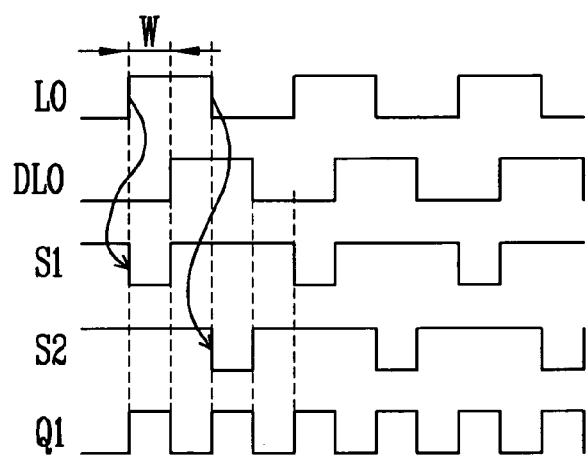
FIG. 6 is a timing diagram illustrating signals related to the operation of the divider circuit shown in FIG. 5.

FIG. 5 is a detailed circuit diagram of the divider circuit shown in FIG. 4. There is shown, in FIG. 5, only the divider circuit 141. The divider circuits 141 to 145 have the same construction and operation and, therefore, only the construction and operation of the divider circuit 141 will be described as an example. The divider circuit 141 includes a delay circuit 160, and first to third logic circuits 170 to 190. The delay circuit 160 delays the divided input signal LO for a set time W and outputs a delay signal DLO. The delay circuit 160 includes inverters 161 and 162 connected in series. The set time W is decided by the number of the inverters included in the delay circuit 160. Accordingly, when the number of the inverters included in the delay circuit 160 increases, the set time W is increased. The first logic circuit 170 outputs a first logic signal S1 in response to the delay signal DLO and the divided input signal LO. The first logic circuit 170 includes an inverter 171 and a NAND gate 172. The inverter 171 inverts the delay signal DLO and outputs an inverted delay signal DLOB. The NAND gate 172 performs an NAND operation on the divided input signal LO and the inverted delay signal DLOB and outputs the first logic signal S1 according to the operation result. Consequently, as shown in FIG. 6, the first logic circuit 170 outputs the first logic signal S1 at a low level during the set time W in synchronization with a rising edge of the divided input signal LO. The second logic circuit 180 outputs a second logic signal S2 in response to the delay signal DLO and the divided input signal LO. The second logic circuit 180 includes an inverter 181 and a NAND gate 182. The inverter 181 inverts the input divided signal LO and outputs an inverted divided input signal LOB. The NAND gate 182 performs a NAND operation on the delay signal DLO and the divided input signal LO and outputs the second logic signal S2 according to the operation result. Consequently, as shown in FIG. 6, the second logic circuit 180 outputs the second logic signal S2 at a low level during the set time W in synchronization with a falling edge of the divided input signal LO. The third logic circuit 190 includes a NAND gate 191 and inverters 192 and 193. The NAND gate 191 performs a NAND operation on the first logic signal S1 and the second logic signal S2 and outputs a third logic signal S3. The NAND gate 191 outputs the third logic signal S3 at a low level only when both the first and second logic signals S1 and S2 are at a high level. The inverters 192 and 193 are connected in series to an output terminal of the NAND gate 191. The inverters 192 and 193 buffer the third logic signal S3 and output it as the divided signal Q1. As shown in FIG. 6, the divided signal Q1 becomes a high level whenever the first logic signal Si and the second logic signal S2 become a low level alternately. Consequently, the cycle of the divided signal Q1 corresponds a half that of the input divided signal LO.

Figure 7:
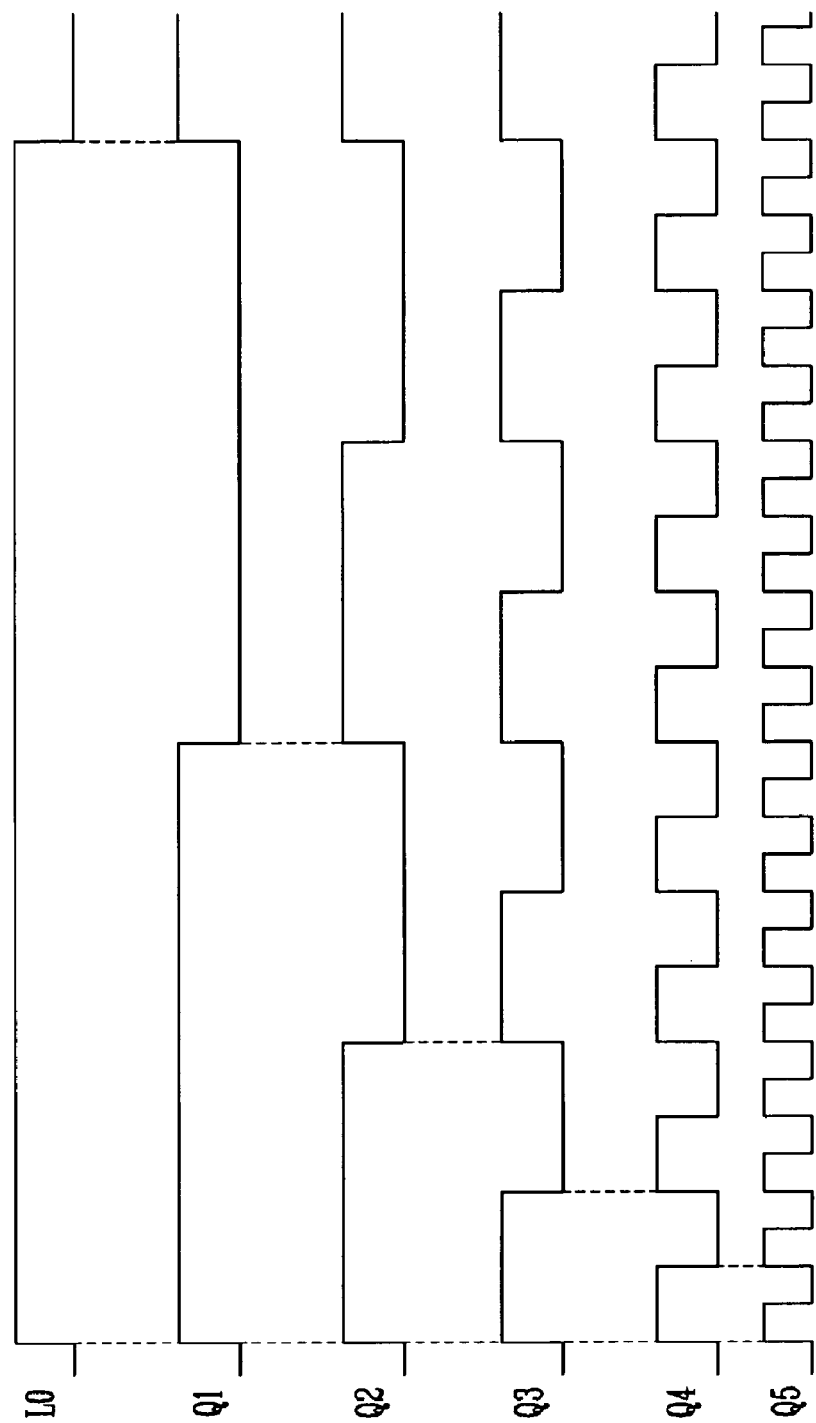
FIG. 7 is a timing diagram illustrating signals related to the operation of the divider shown in FIG. 4.

FIG. 7 is a timing diagram illustrating signals related to the operation of the divider shown in FIG. 4. From FIG. 7, it can be seen that as the divided number of the divided input signal LO is increased, the cycle of the divided signal becomes gradually small. Assuming that the cycle of the divided input signal LO is "A" and the cycles of the divided signals Q1 to Q5 are "B1 to B5", respectively, the cycles of the divided signals Q1 to Q5 can be expressed in the following equation.

$$B1 = \frac{1}{2}A,$$
$$B2 = \frac{1}{4}A,$$
$$B3 = \frac{1}{8}A,$$
$$B4 = \frac{1}{16}A,$$
$$B5 = \frac{1}{32}A$$

[Equation 1]

As expressed in Equation 1, the cycle B1 of the divided signal Q1 corresponds to half that of the divided input signal LO, the cycle B2 of the divided signal Q2 corresponds to ¼ of that of the divided input signal LO. Furthermore, the cycle B3 of the divided signal Q3 corresponds to ⅛ of that of the divided input signal LO, the cycle B4 of the divided signal Q4 corresponds to 1/16 of that of the divided input signal LO, and the cycle B5 of the divided signal Q5 corresponds to 1/32 of that of the divided input signal LO. The operation of the internal voltage generator 100 will be described below in more detail. The oscillator 110 generates the oscillation signal OSC. If the test signal TALLWD is enabled, the cycle control unit 120 controls the cycle of the oscillation signal OSC and outputs the controlled oscillation signal DOSC to the output node OUT. The voltage generator 130 generates the boosting voltage VPP in response to the controlled oscillation signal DOSC. Thereafter, if the test signal TALLWD is disabled, the cycle control unit 120 outputs the output node OUT without controlling the cycle of the oscillation signal OSC. The voltage generator 130 generates the boosting voltage VPP in response to the oscillation signal OSC received from the cycle control unit 120 through the output node OUT. The voltage generator 130 operates faster when receiving the controlled oscillation signal DOSC than when receiving the oscillation signal OSC. Consequently, in a test mode in which the consumption of the boosting voltage VPP is increased, the operating speed of the voltage generator 130 is increased. Meanwhile, in a normal mode in which the consumption of the boosting voltage VPP is decreased, the operating speed of the voltage generator 130 is decreased.

Figure 8:
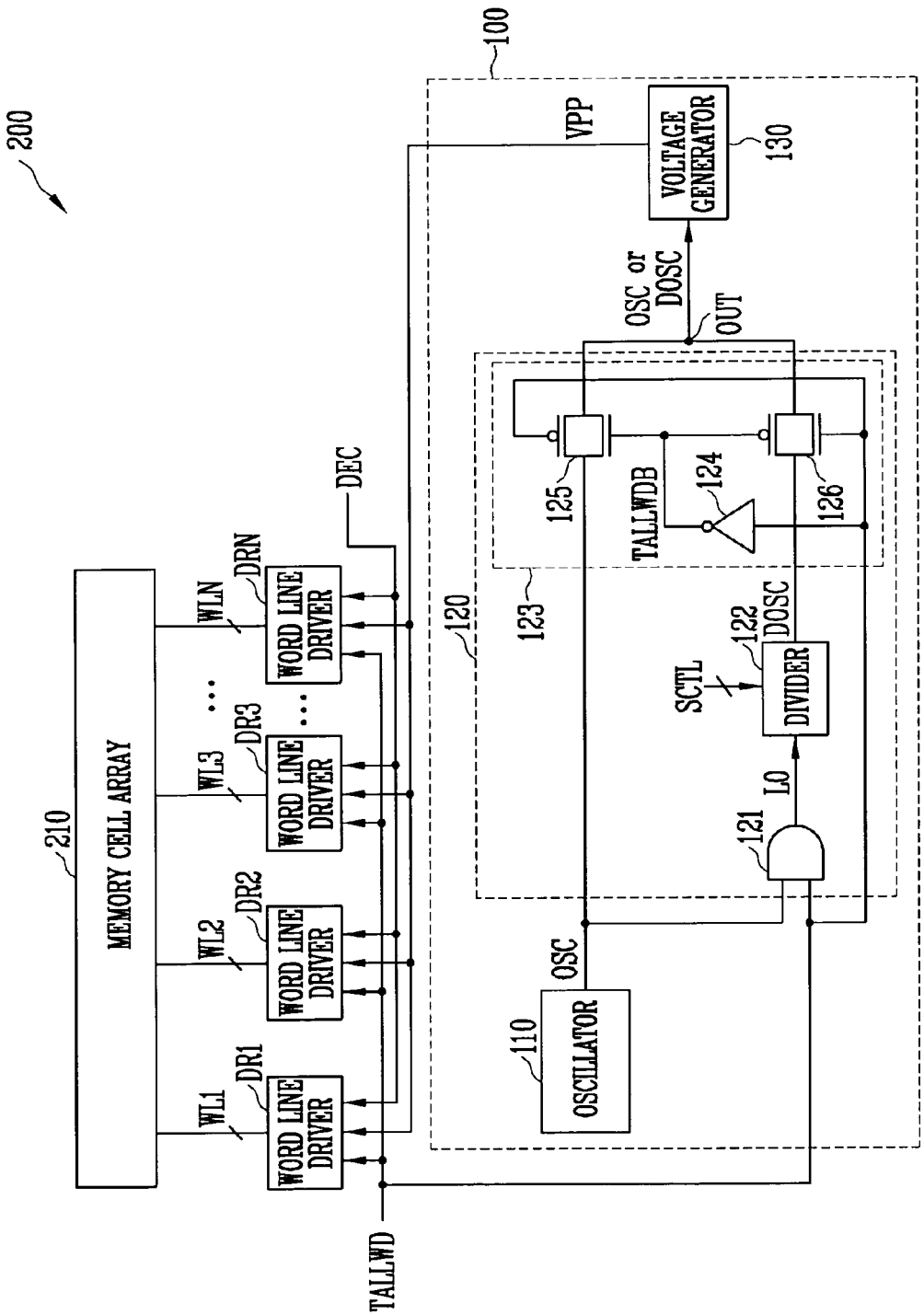
FIG. 8 is a block diagram of a semiconductor memory device according to an embodiment of the present invention.

FIG. 8 is a block diagram of a semiconductor memory device according to an embodiment of the present invention. There are shown, in FIG. 8, only parts related to the present invention in order to simplify the drawing. Referring to FIG. 8, a semiconductor memory device 200 includes a memory cell array 210, word line drivers DR1 to DRN (N is an integer), and an internal voltage generator 100. The memory cell array includes a plurality of memory cells (not shown). The word line drivers DR1 to DRN are connected to word lines WL1 to WLN, respectively, which are included in the memory cell array 210, and use the boosting voltage VPP for operating power. The word line drivers DR1 to DRN enable the word lines WL1 to WLN, respectively, in response to the test signal TALLWD or an address decoding signal DEC. Preferably, in the test mode, the word line drivers DR1 to DRN enable the word lines WL1 to WLN at the same time in response to the test signal TALLWD. Furthermore, in the normal mode, one of the word line drivers DR1 to DRN enables one of the word lines WL1 to WLN in response to the address decoding signal DEC. The internal voltage generator 100 includes an oscillator 110, a cycle control unit 120 and a voltage generator 130. The construction and operation of the internal voltage generator 100 are substantially the same as those of the internal voltage generator that has been described with reference to FIG. 3. Accordingly, they will not be described in order to avoid redundancy. The operation of the internal voltage generator 100 at the time of the test operation of the semiconductor memory device 200 will be described below with reference to FIG. 9.

Figure 9:
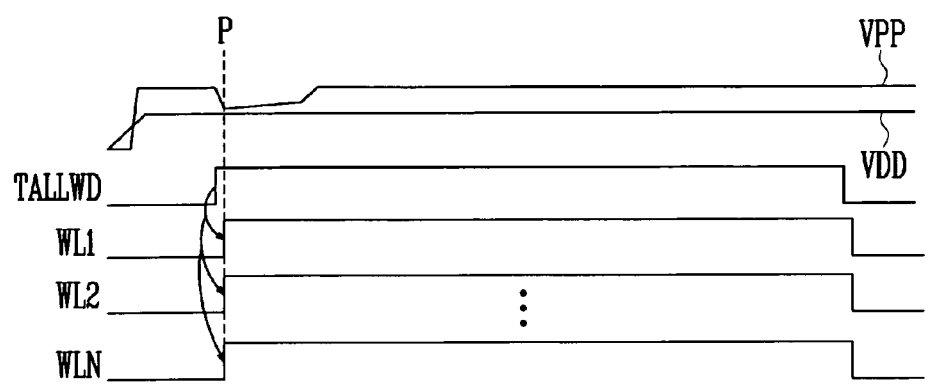
FIG. 9 is a timing diagram illustrating signals related to the test operation of the semiconductor memory device shown in FIG. 8.

FIG. 9 is a timing diagram illustrating signals related to the test operation of the semiconductor memory device shown in FIG. 8. In a word line test process performed in the WFBI test mode of the semiconductor memory device 200, the test signal TALLWD is enabled. The cycle control unit 120 of the internal voltage generator 100 controls the cycle of the oscillation signal OSC received from the oscillator 110 in response to the test signal TALLWD. At this time, the cycle control unit 120 decides a cycle to be controlled according to a bit value of the selection signal SCTL. The voltage generator 130 of the internal voltage generator 100 generates the boosting voltage VPP in response to the controlled oscillation signal DOSC. The word line drivers DR1 to DRN use the boosting voltage VPP for operating power and enable the word lines WL1 to WLN of the memory cell array 210 at a time in response to the test signal TALLWD. At this time, since the consumption of the boosting voltage VPP by the word line drivers DR1 to DRN abruptly increases, the boosting voltage VPP temporarily drops at a point of time P (refer to FIG. 9) at which the word lines WL1 to WLN are enabled. However, since the voltage generator 130 operates in response to the controlled oscillation signal DOSC having a cycle smaller than that of the oscillation signal OSC, it can recover the dropped boosting voltage VPP to a normal voltage level rapidly. Accordingly, the boosting voltage VPP can be always kept higher than the external voltage VDD as shown in FIG. 9. Meanwhile, during a period in which the test signal TALLWD is disabled (that is, during the normal operating period of the semiconductor memory device 200), the cycle control unit 120 outputs the oscillation signal OSC to the voltage generator 130 without change. The operating speed of the voltage generator 130 is slower when receiving the oscillation signal OSC than when receiving the controlled oscillation signal DOSC. As a result, at the time of the normal operation of the semiconductor memory device 200, the operating speed of the voltage generator 130 is decreased and the boosting voltage VPP is not excessively increased. In other words, the cycle control unit 120 operates only in the test mode of the semiconductor memory device 200, and the normal mode does have nothing influence on the operation of the voltage generator 130.

Figure 10:
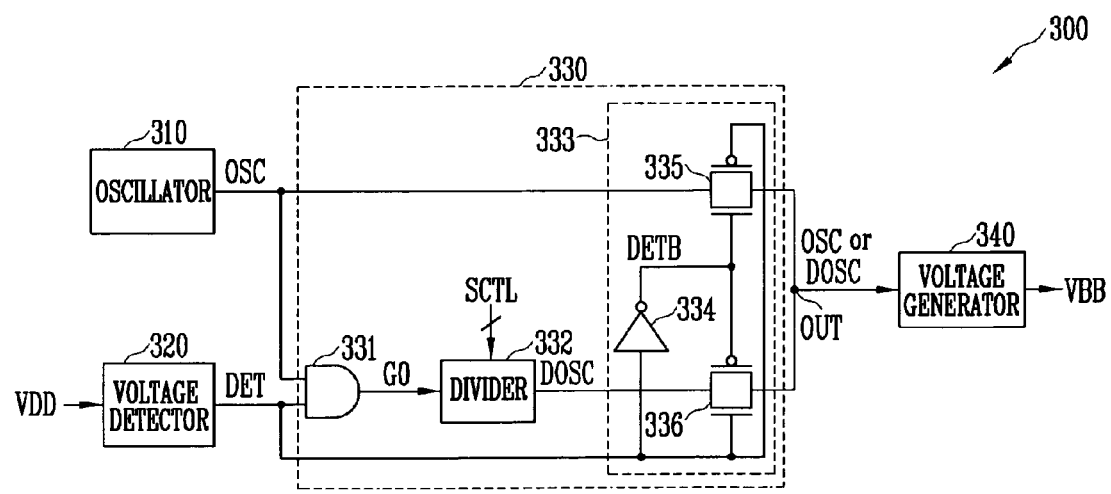
FIG. 10 is a circuit diagram of an internal voltage generator according to anther embodiment of the present invention.
Figure 11:
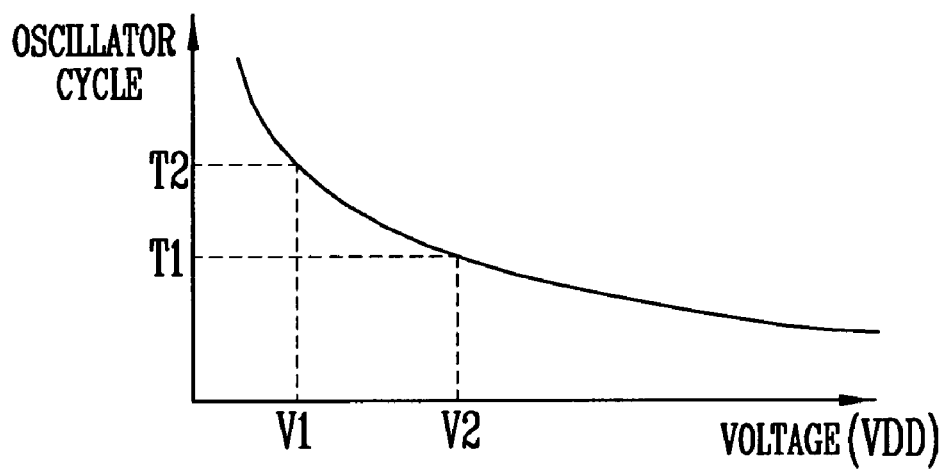
FIG. 11 is a graph showing the relationship between the oscillation cycle of an oscillator shown in FIG. 10 and an external voltage.
Figure 12:
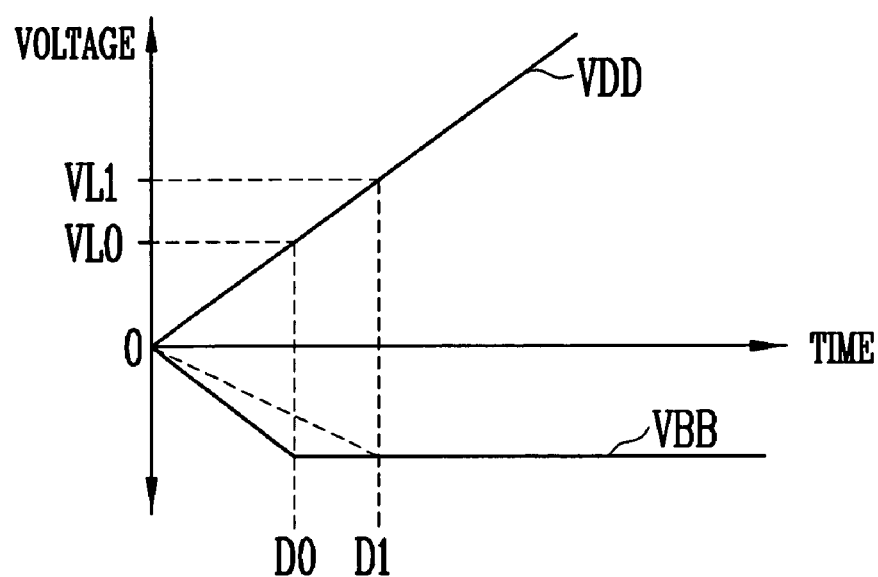
FIG. 12 is a graph illustrating a back bias voltage generated by the internal voltage generator shown in FIG. 10 and an external voltage.

FIG. 10 is a circuit diagram of an internal voltage generator according to anther embodiment of the present invention. Referring to FIG. 10, an internal voltage generator 300 includes an oscillator 310, a voltage detector 320, a cycle control unit 330 and a voltage generator 340. The oscillator 310 generates a pulse shaped oscillation signal OSC periodically. The voltage detector 320 detects an external voltage VDD and outputs a detection signal DET according to the detection result. In more detail, when the external voltage VDD is higher than a detection voltage VL0 (refer to FIG. 12), the voltage detector 320 disables the detection signal DET (that is, a low level). In contrast, when the external voltage VDD is lower than the detection voltage VLO, the voltage detector 320 enables the detection signal DET (that is, a high level). The cycle control unit 330 bypasses the oscillation signal OSC to an output node OUT, or selectively controls the cycle of the oscillation signal OSC and outputs a controlled oscillation signal DOSC to the output node OUT in response to the detection signal DET and a selection signal SCTL. The construction and operation of the cycle control unit 330 are the same as those of the cycle control unit 120 that has been described with reference to FIGS. 3 to 7 and, therefore, will not be described. The voltage generator 340 generates a back bias voltage VBB (i.e., an internal voltage) in response to the oscillation signal OSC or the controlled oscillation signal DOSC received through the output node OUT. The operation of the internal voltage generator 300 will be described below in more detail. The oscillator 310 first generates the oscillation signal OSC. As shown in FIG. 11, the cycle of the oscillation signal OSC is in inverse proportion to the external voltage VDD. In other words, as the external voltage VDD decreases, the cycle of the oscillation signal OSC is increased, whereas as the external voltage VDD increases, the cycle of the oscillation signal OSC is decreased. Meanwhile, in the power-up period (that is, in an active mode of a semiconductor chip, during a period in which the external voltage VDD begins rising and then becomes a stable voltage), the voltage detector 320 detects the external voltage VDD. When the external voltage VDD is lower than the detection voltage VL0, the voltage detector 320 enables the detection signal DET. The cycle control unit 330 controls the cycle of the oscillation signal OSC received from the oscillator 310 and outputs a controlled oscillation signal DOSC to the output node OUT, in response to the detection signal DET. The voltage generator 340 generates the back bias voltage VBB in response to the controlled oscillation signal DOSC. Thereafter, the voltage detector 320 disables the detection signal DET when the external voltage VDD is higher than the detection voltage VL0. As a result, the cycle control unit 330 outputs the oscillation signal OSC to the output node OUT without changing the cycle of the oscillation signal OSC in response to the detection signal DET. The voltage generator 340 generates the back bias voltage VBB in response to the oscillation signal OSC received from the cycle control unit 330 through the output node OUT. The voltage generator 340 operates faster when receiving the controlled oscillation signal DOSC than when receiving the oscillation signal OSC. Consequently, in the power-up period, the back bias voltage VBB can be stabilized at a point of time DO (that is, a point of time at which the external voltage VDD becomes the detection voltage VLO) anterior to a point of time D1 at which the external voltage VDD becomes a set voltage VL1. As described above, the internal voltage generator 300 can advance the point of time at which the back bias voltage VBB is stabilized in the power-up period. Accordingly, the operational performance of a semiconductor device including the internal voltage generator 100 can be improved.

Figure 13:
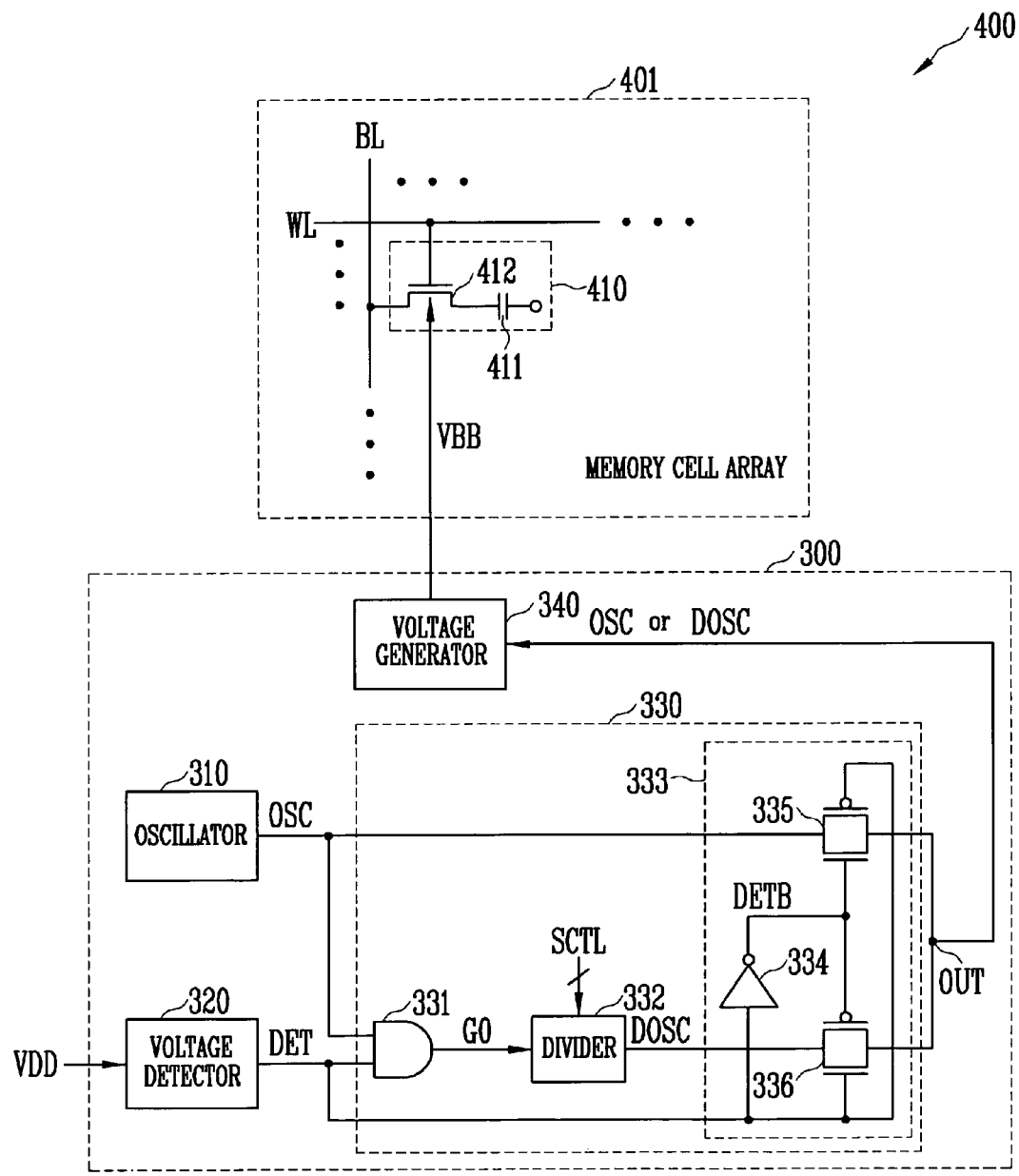
FIG. 13 is a block diagram of a semiconductor memory device according to anther embodiment of the present invention.

FIG. 13 is a block diagram of a semiconductor memory device according to another embodiment of the present invention. There are shown, in FIG. 13, only parts related to the present invention in order to simplify the drawing. Referring to FIG. 13, a semiconductor memory device 400 includes a memory cell array 401 and an internal voltage generator 300. The memory cell array 401 includes a plurality of memory cells. It has been shown in FIG. 13 that the memory cell array 401 includes only one memory cell 410, one word line WL and one bit line BL in order to simplify the drawing. However, in reality, the memory cell array 401 includes a plurality of memory cells, a plurality of word lines and a plurality of bit lines. The memory cell 410 includes a cell capacitor 411 and a cell transistor 412. The cell transistor 412 has a gate connected to the word line W, a drain connected to the bit line BL, and a source connected to the cell capacitor 411. The cell transistor 412 is supplied with the back bias voltage VBB. The internal voltage generator 300 includes an oscillator 310, a voltage detector 320, a cycle control unit 330 and a voltage generator 340. The construction and operation of the internal voltage generator 300 are the same as those of the internal voltage generator that has been described with reference to FIGS. 10 to 12 and, therefore, will not be described.

As described above, according to the internal voltage generator and the semiconductor memory device including the same, and the method of generating the internal voltage in accordance with the present invention, a stable internal voltage can be generated rapidly. It is therefore possible to improve the operational performance of semiconductor memory devices.

Although the foregoing description has been made with reference to the various embodiments, it is to be understood that changes and modifications of the present patent may be made by those having ordinary skill in the art without departing from the spirit and scope of the present patent and appended claims.

What is claimed is:

1. An internal voltage generator comprising:
   an oscillator for periodically generating a pulse-shaped oscillation signal;
   a cycle control unit for bypassing the oscillation signal to an output node, or selectively controlling a cycle of the oscillation signal and outputting a controlled oscillation signal to the output node, in response to a test signal and a selection signal; and
   a voltage generator for generating an internal voltage in response to the oscillation signal or the controlled oscillation signal received through the output node,
   wherein the cycle of the controlled oscillation signal is shorter than the cycle of the oscillation signal, an operating speed of the voltage generator when receiving the controlled oscillation signal is faster than that of the voltage generator when receiving the oscillation signal, and the test signal is generated at the time of a test operation of a word line of a semiconductor memory device.

2. The internal voltage generator of claim 1, wherein the internal voltage includes a boosting voltage.

3. The internal voltage generator of claim 1, wherein the cycle control unit comprises:
   a control logic circuit for outputting a divided input signal in response to the test signal and the oscillation signal;
   a divider for dividing a cycle of the divided input signal and outputting the controlled oscillation signal, in response to the selection signal; and
   a selection circuit for selecting one of the oscillation signal and the controlled oscillation signal and outputting a selected signal to the output node, in response to the test signal.

4. The internal voltage generator of claim 3, wherein the control logic circuit comprises an AND gate for performing an AND operation on the oscillation signal and the test signal and outputting the divided input signal according to the operation result.

5. The internal voltage generator of claim 3, wherein the divider comprises:
   a plurality of divider circuits connected in series, for outputting a plurality of divided signals; and
   a clock selection unit for selecting one of the plurality of divided signals and outputting a selected signal as the controlled oscillation signal, in response to the selection signal,
   wherein one of the plurality of divider circuits receives the divided input signal, and each of the remaining divider circuits receive a divided signal output by a previous divider circuit and output a divided signal, and
   the cycles of the plurality of divided signals are different from each other.

6. The internal voltage generator of claim 5, wherein each of the plurality of divider circuits comprises:
   a delay circuit for delaying the divided input signal or one of the plurality of divided signals for a set time and outputting a delay signal;
   a first logic circuit for outputting a first logic signal in response to the delay signal and the divided input signal or one of the plurality of divided signals;
   a second logic circuit for outputting a second logic signal in response to the delay signal and the divided input signal or one of the plurality of divided signals; and
   a third logic circuit for outputting one of the plurality of divided signals in response to the first logic signal and the second logic signal,
   wherein the first logic circuit has a phase different from that of the second logic circuit.

7. The internal voltage generator of claim 6, wherein the first logic circuit comprises:
   an inverter for inverting the delay signal and outputting an inverted delay signal; and
   a NAND gate for performing a NAND operation on the divided input signal or one of the plurality of divided signals and the inverted delay signal and outputting the first logic signal according to the operation result.

8. The internal voltage generator of claim 6, wherein the second logic circuit comprises:
   an inverter for inverting the divided input signal or one of the plurality of divided signals and outputting an inverted divided input signal; and
   a NAND gate for performing a NAND operation on the delay signal and the inverted divided input signal and outputting the second logic signal according to the operation result.

9. The internal voltage generator of claim 1, wherein:
   the test signal is enabled at the time of the test operation of the word line of the semiconductor memory device, and
   when the test signal is enabled, the cycle control unit controls the cycle of the oscillation signal in response to the selection signal.

10. A semiconductor memory device comprising:
    a memory cell array;
    a plurality of word line drivers connected to a plurality of word lines included in the memory cell array, wherein the word line drivers use a boosting voltage for operating power and enable the plurality of word lines in response to a test signal or an address decoding signal; and
    an internal voltage generator for generating the boosting voltage in response to the test signal and a selection signal,
    wherein in a test mode, the plurality of word line drivers enable the plurality of word lines at the same time in response to the test signal, and in a normal mode, one of the plurality of word line drivers enables one of the plurality of word lines in response to the address decoding signal, and an operating speed of the internal voltage generator is different in the test mode and the normal mode.

11. The semiconductor memory device of claim 10, wherein the internal voltage generator comprises:
an oscillator for periodically generating a pulse-shaped oscillation signal;
a cycle control unit for bypassing the oscillation signal to an output node, or selectively controlling a cycle of the oscillation signal and outputting a controlled oscillation signal to the output node, in response to the test signal and the selection signal; and
a voltage generator for generating the boosting voltage in response to the oscillation signal or the controlled oscillation signal received through the output node,
wherein the cycle of the controlled oscillation signal is shorter than the cycle of the oscillation signal, an operating speed of the voltage generator when receiving the controlled oscillation signal is faster than those when receiving the oscillation signal.

12. The semiconductor memory device of claim 11, wherein the cycle control unit comprises:
a control logic circuit for outputting a divided input signal in response to the test signal and the oscillation signal;
a divider for dividing a cycle of the divided input signal and outputting the controlled oscillation signal, in response to the selection signal; and
a selection circuit for selecting one of the oscillation signal and the controlled oscillation signal and outputting a selected signal to the output node, in response to the test signal.

13. The semiconductor memory device of claim 12, wherein the control logic circuit comprises an AND gate for performing an AND operation on the oscillation signal and the test signal and outputting the divided input signal according to the operation result.

14. The semiconductor memory device of claim 12, wherein the divider comprises:
a plurality of divider circuits connected in series, for outputting a plurality of divided signals, respectively; and
a clock selection unit for selecting one of the plurality of divided signals and outputting a selected signal as the controlled oscillation signal, in response to the selection signal,
wherein one of the plurality of divider circuits receives the divided input signal, and each of the remaining divider circuits receive a divided signal output by a previous divider circuit and output a divided signal, and
the cycles of the plurality of divided signals are different from each other.

15. The semiconductor memory device of claim 14, wherein each of the plurality of divider circuits comprises:
a delay circuit for delaying the divided input signal or one of the plurality of divided signals for a set time and outputting a delay signal;
a first logic circuit for outputting a first logic signal in response to the delay signal and the divided input signal or one of the plurality of divided signals;
a second logic circuit for outputting a second logic signal in response to the delay signal and the divided input signal or one of the plurality of divided signals; and
a third logic circuit for outputting one of the plurality of divided signals in response to the first logic signal and the second logic signal, wherein the first logic circuit has a phase different from that of the second logic circuit.

16. The semiconductor memory device of claim 15, wherein the first logic circuit comprises:
an inverter for inverting the delay signal and outputting an inverted delay signal; and
a NAND gate for performing a NAND operation on the divided input signal or one of the plurality of divided signals and the inverted delay signal and outputting the first logic signal according to the operation result.

17. The semiconductor memory device of claim 15, wherein the second logic circuit comprises:
an inverter for inverting the divided input signal or one of the plurality of divided signals and outputting an inverted divided input signal; and
a NAND gate for performing a NAND operation on the delay signal and the inverted divided input signal and outputting the second logic signal according to the operation result.

18. The semiconductor memory device of claim 10, wherein:
the test signal is enabled at the time of the test mode, and
when the test signal is enabled, the cycle control unit controls the cycle of the oscillation signal in response to the selection signal.

19. An internal voltage generator comprising:
an oscillator for periodically generating a pulse-shaped oscillation signal;
a voltage detector for detecting an external voltage and outputting a detection signal according to the detection result;
a cycle control unit for bypassing the oscillation signal to an output node, or selectively controlling a cycle of the oscillation signal and outputting a controlled oscillation signal to the output node, in response to a detection signal and a selection signal; and
a voltage generator for generating an internal voltage in response to the oscillation signal or the controlled oscillation signal received through the output node,
wherein the cycle of the controlled oscillation signal is shorter than the cycle of the oscillation signal, and an operating speed of the voltage generator when receiving the controlled oscillation signal is faster than that of the voltage generator when receiving the oscillation signal.

20. The internal voltage generator of claim 19, wherein the internal voltage includes a back bias voltage.

21. The internal voltage generator of claim 19, wherein the cycle control unit comprises:
a control logic circuit for outputting a divided input signal in response to the detection signal and the oscillation signal;
a divider for dividing a cycle of the divided input signal and outputting the controlled oscillation signal, in response to the selection signal; and
a selection circuit for selecting one of the oscillation signal and the controlled oscillation signal and outputting a selected signal to the output node, in response to the detection signal.

22. The internal voltage generator of claim 21, wherein the control logic circuit comprises an AND gate for performing an AND operation on the oscillation signal and the detection signal and outputting the divided input signal according to the operation result.

23. The internal voltage generator of claim 21, wherein the divider comprises:
a plurality of divider circuits connected in series, for outputting a plurality of divided signals, respectively; and a clock selection unit for selecting one of the plurality of divided signals and outputting a selected signal as the controlled oscillation signal, in response to the selection signal, wherein one of the plurality of divider circuits receives the divided input signal, and each of the remaining divider circuits receive a divided signal output by a previous divider circuit and output a divided signal, and the cycles of the plurality of divided signals are different from each other.

24. The internal voltage generator of claim 23, wherein each of the plurality of divider circuits comprises:

a delay circuit for delaying the divided input signal or one of the plurality of divided signals for a set time and outputting a delay signal;

a first logic circuit for outputting a first logic signal in response to the delay signal and the divided input signal or one of the plurality of divided signals;

a second logic circuit for outputting a second logic signal in response to the delay signal and the divided input signal or one of the plurality of divided signals; and a third logic circuit for outputting one of the plurality of divided signals in response to the first logic signal and the second logic signal, wherein the first logic circuit has a phase different from that of the second logic circuit.

25. The internal voltage generator of claim 24, wherein the first logic circuit comprises:

an inverter for inverting the delay signal and outputting an inverted delay signal; and a NAND gate for performing a NAND operation on the divided input signal or one of the plurality of divided signals and the inverted delay signal and outputting the first logic signal according to the operation result.

26. The internal voltage generator of claim 24, wherein the second logic circuit comprises:

an inverter for inverting the divided input signal or one of the plurality of divided signals and outputting an inverted divided input signal; and a NAND gate for performing a NAND operation on the delay signal and the inverted divided input signal and outputting the second logic signal according to the operation result.

27. The internal voltage generator of claim 19, wherein:

the voltage detector disables the detection signal when the external voltage becomes a detection voltage, and when the detection signal is enabled, the cycle control unit controls the cycle of the oscillation signal in response to the selection signal.

28. A semiconductor memory device: comprising:

a memory cell array including a plurality of memory cells connected to a plurality of word lines and a plurality of bit lines, each of the memory cells including a cell transistor; and an internal voltage generator for detecting an external voltage, generating a back bias voltage according to the detection result, and supplying the back bias voltage to a bulk of the cell transistor, wherein an operating speed of the internal voltage generator is faster when the external voltage is lower than a detection voltage, and the operating speed of the internal voltage generator is slower when the external voltage is higher than a detection voltage.

29. The semiconductor memory device of claim 28, wherein the internal voltage generator comprises:

an oscillator for periodically generating a pulse-shaped oscillation signal;

a voltage detector for detecting the external voltage and outputting a detection signal according to the detection result;

a cycle control unit for bypassing the oscillation signal to an output node, or selectively controlling a cycle of the oscillation signal and outputting a controlled oscillation signal to the output node, in response to a detection signal and a selection signal; and a voltage generator for generating an internal voltage in response to the oscillation signal or the controlled oscillation signal received through the output node, wherein the cycle of the controlled oscillation signal is shorter than the cycle of the oscillation signal, and an operating speed of the voltage generator when receiving the controlled oscillation signal is faster than that of the voltage generator when receiving the oscillation signal.

30. The semiconductor memory device of claim 29, wherein the cycle control unit comprises:

a control logic circuit for outputting a divided input signal in response to the detection signal and the oscillation signal;

a divider for dividing a cycle of the divided input signal and outputting the controlled oscillation signal, in response to the selection signal; and a selection circuit for selecting one of the oscillation signal and the controlled oscillation signal and outputting a selected signal to the output node, in response to the detection signal.

31. The semiconductor memory device of claim 30, wherein the control logic circuit comprises an AND gate for performing an AND operation on the oscillation signal and the detection signal and outputting the divided input signal according to the operation result.

32. The semiconductor memory device of claim 30, wherein the divider comprises:

a plurality of divider circuits connected in series, for outputting a plurality of divided signals, respectively; and a clock selection unit for selecting one of the plurality of divided signals and outputting a selected signal as the controlled oscillation signal, in response to the selection signal, wherein one of the plurality of divider circuits receives the divided input signal, and each of the remaining divider circuits receive a divided signal output by a previous divider circuit and output a divided signal, and the cycles of the plurality of divided signals are different from each other.

33. The semiconductor memory device of claim 32, wherein each of the plurality of divider circuits comprises:

a delay circuit for delaying the divided input signal or one of the plurality of divided signals for a set time and outputting a delay signal;

a first logic circuit for outputting a first logic signal in response to the delay signal and the divided input signal or one of the plurality of divided signals;

a second logic circuit for outputting a second logic signal in response to the delay signal and the divided input signal or one of the plurality of divided signals; and a third logic circuit for outputting one of the plurality of divided signals in response to the first logic signal and the second logic signal, wherein the first logic circuit has a phase different from that of the second logic circuit.

34. The semiconductor memory device of claim 33, wherein the first logic circuit comprises:

an inverter for inverting the delay signal and outputting an inverted delay signal; and a NAND gate for performing a NAND operation on the divided input signal or one of the plurality of divided signals and the inverted delay signal and outputting the first logic signal according to the operation result.

35. The semiconductor memory device of claim 33, wherein the second logic circuit comprises:

an inverter for inverting the divided input signal or one of the plurality of divided signals and outputting an inverted divided input signal; and a NAND gate for performing a NAND operation on the delay signal and the inverted divided input signal and outputting the second logic signal according to the operation result.

36. The semiconductor memory device of claim 29, wherein:

the voltage detector disables the detection signal when the external voltage reaches a detection voltage, and when the detection signal is enabled, the cycle control unit controls the cycle of the oscillation signal in response to the selection signal.

37. A method of generating an internal voltage, comprising the steps of:

periodically generating a pulse-shaped oscillation signal;

at the time of a test operation of a device using a boosting voltage for operating power, generating a controlled oscillation signal having a cycle shorter than that of the oscillation signal based on the oscillation signal;

generating the boosting voltage based on the controlled oscillation signal; and when the test operation of the device using the boosting voltage as the operating power is ended, generating the boosting voltage based on the oscillation signal.

38. A method of generating an internal voltage, comprising the steps of:

periodically generating a pulse-shaped oscillation signal;

when an external voltage is lower than a detection voltage, generating a controlled oscillation signal having a cycle shorter than that of the oscillation signal based on the oscillation signal;

generating back bias voltage based on the controlled oscillation signal; and when the external voltage is higher than the detection voltage, generating the back bias voltage based on the oscillation signal.

* * * * *